United States Patent
Ramirez (10) Patent No.: US 9,753,063 B2
(45) Date of Patent: Sep. 5, 2017

(54) LOAD SIDE VOLTAGE SENSING FOR UTILITY METER

(71) Applicant: Landis+Gyr, Inc., Lafayette, IN (US)

(72) Inventor: Anibal Diego Ramirez, Indianapolis, IN (US)

(73) Assignee: Landis+Gyr Inc., Lafayette, IN (US)

( * ) Notice: Subject to any disclaimer, the term of this patent is extended or adjusted under 35 U.S.C. 154(b) by 264 days.

(21) Appl. No.: 14/584,067

(22) Filed: Dec. 29, 2014

(65) Prior Publication Data

US 2016/0187393 A1 Jun. 30, 2016

(51) Int. Cl.
*G01R 19/00* (2006.01)
*G01R 19/155* (2006.01)
*G01R 31/02* (2006.01)
*G01R 31/04* (2006.01)
*G01R 1/00* (2006.01)
*H02H 3/00* (2006.01)
*G01R 19/04* (2006.01)
*G01R 19/175* (2006.01)
*G01R 21/06* (2006.01)
*G01R 22/10* (2006.01)

(52) U.S. Cl.
CPC ......... *G01R 19/155* (2013.01); *G01R 31/026* (2013.01); *G01R 19/04* (2013.01); *G01R 19/175* (2013.01); *G01R 21/06* (2013.01); *G01R 22/10* (2013.01)

(58) Field of Classification Search
CPC ...... G01R 19/00; G01R 19/155; G01R 31/02; G01R 31/04; G01R 1/00; H02H 3/00; H02H 3/20
USPC ......... 324/76.11, 110, 126; 340/637; 361/60, 361/86
See application file for complete search history.

(56) References Cited

U.S. PATENT DOCUMENTS

| | | |
|---|---|---|
| 3,916,309 A | 10/1975 | Foulkes |
| 2004/0150384 A1 | 8/2004 | Holle et al. |
| 2008/0204953 A1 | 8/2008 | Shuey |
| 2009/0015234 A1* | 1/2009 | Voisine ................. H01F 27/422 323/355 |
| 2009/0261805 A1 | 10/2009 | Shuey |
| 2011/0285382 A1 | 11/2011 | Kolwalkar et al. |

OTHER PUBLICATIONS

International Search Report and Written Opinion of PCT/US2015/067848, dated Apr. 29, 2016.

* cited by examiner

*Primary Examiner* — Son Le
*Assistant Examiner* — Neel Shah
(74) *Attorney, Agent, or Firm* — Maginot, Moore & Beck LLP (57) ABSTRACT

An arrangement for use in a utility meter includes at least one circuit path, a three phase service switch, and a three phase monitoring unit. The at least one circuit path operably couples a source of electrical energy to a load. The service switch is operably coupled to the at least one circuit path and is configurable in an open state and a closed state. The monitoring unit is operably coupled to the at least one circuit path between the load and the service switch and is configured to detect a presence and an absence of line voltage on the load. The monitoring unit is further configured (i) to generate an open circuit signal responsive to the detection of the absence of line voltage on the load, and (ii) to generate a closed circuit signal responsive to the detection of the presence of line voltage on the load.

17 Claims, 5 Drawing Sheets

LOAD SIDE VOLTAGE SENSING FOR UTILITY METER

FIELD

This disclosure relates to the field of utility meters, and particularly, to an electricity meter having a three phase service switch.

BACKGROUND

Utility meters are devices that, among other things, measure the consumption of a utility-generated commodity, such as electrical energy, gas, or water, by a facility, such as a residence, a factory, or a commercial establishment. Utility service providers employ utility meters to track customer usage of the utility-generated commodities for reasons including billing and demand forecasting of the commodity.

Electricity meters are a type of utility meter configured to measure quantities related to the consumption of electrical energy by a facility or other load. Typically, the electrical service provider provides the load with uninterrupted access to the source of electrical energy. However, in some situations, such as when the customer's invoices are in arrears, the electrical service provider may determine that it is necessary to prevent access to electrical energy at the customer's load. To this end, some electricity meters include a service switch that is configurable in a closed state to provide electrical energy to the load and in an open state to interrupt access to electrical energy through the utility meter. Depending on the model, the service switch may be remotely controllable so that a technician can provide or interrupt access to electrical energy through the electricity meter without having to configure the electricity meter on site.

After sending a remote signal to the service switch of an electricity meter, the utility service provider is typically unable to determine if the service switch has successfully entered the desired operating state. If the service switch fails to enter the desired operating state then the electricity meter may (i) prevent a paying customer from accessing the electrical energy, or (ii) enable a customer to access the electrical energy when it is not desirable to do so.

Thus, a continuing need exists to increase the performance of utility meters so that the utility service provider is able to accurately and reliably determine the operating state of a service switch of an electricity meter and other types of utility meters having service switches.

SUMMARY

According to an exemplary embodiment of the disclosure, an arrangement for use in a utility meter includes at least one circuit path, a service switch, and a monitoring unit. The at least one circuit path operably couples a source of electrical energy to a load. The service switch is operably coupled to the at least one circuit path and is configurable in (i) an open state in which an open circuit is formed in the at least one circuit path, and (ii) a closed state in which a closed circuit is formed in the at least one circuit path. The monitoring unit is operably coupled to the at least one circuit path between the load and the service switch and is configured to detect a presence and an absence of line voltage on the load. The monitoring unit is further configured (i) to generate an open circuit signal responsive to the detection of the absence of line voltage on the load, and (ii) to generate a closed circuit signal responsive to the detection of the presence of line voltage on the load.

According to another exemplary embodiment of the disclosure, a method of operating a utility meter includes disconnecting a load from a source of electrical energy by forming an open circuit in at least one circuit path operably coupling the source to the load with a service switch, and connecting the load to the source of electrical energy by forming a closed circuit in the at least one circuit path with the service switch. The method further includes detecting a presence or an absence of line voltage on the load, generating an open circuit signal responsive to the detection of the absence of line voltage on the load, and generating a closed circuit signal responsive to the detection of the presence of line voltage on the load.

BRIEF DESCRIPTION OF THE FIGURES

The above-described features and advantages, as well as others, should become more readily apparent to those of ordinary skill in the art by reference to the following detailed description and the accompanying figures in which.

DETAILED DESCRIPTION

For the purpose of promoting an understanding of the principles of the disclosure, reference will now be made to the embodiments illustrated in the drawings and described in the following written specification. It is understood that no limitation to the scope of the disclosure is thereby intended. It is further understood that this disclosure includes any alterations and modifications to the illustrated embodiments and includes further applications of the principles of the disclosure as would normally occur to one skilled in the art to which this disclosure pertains.

Figure 1:
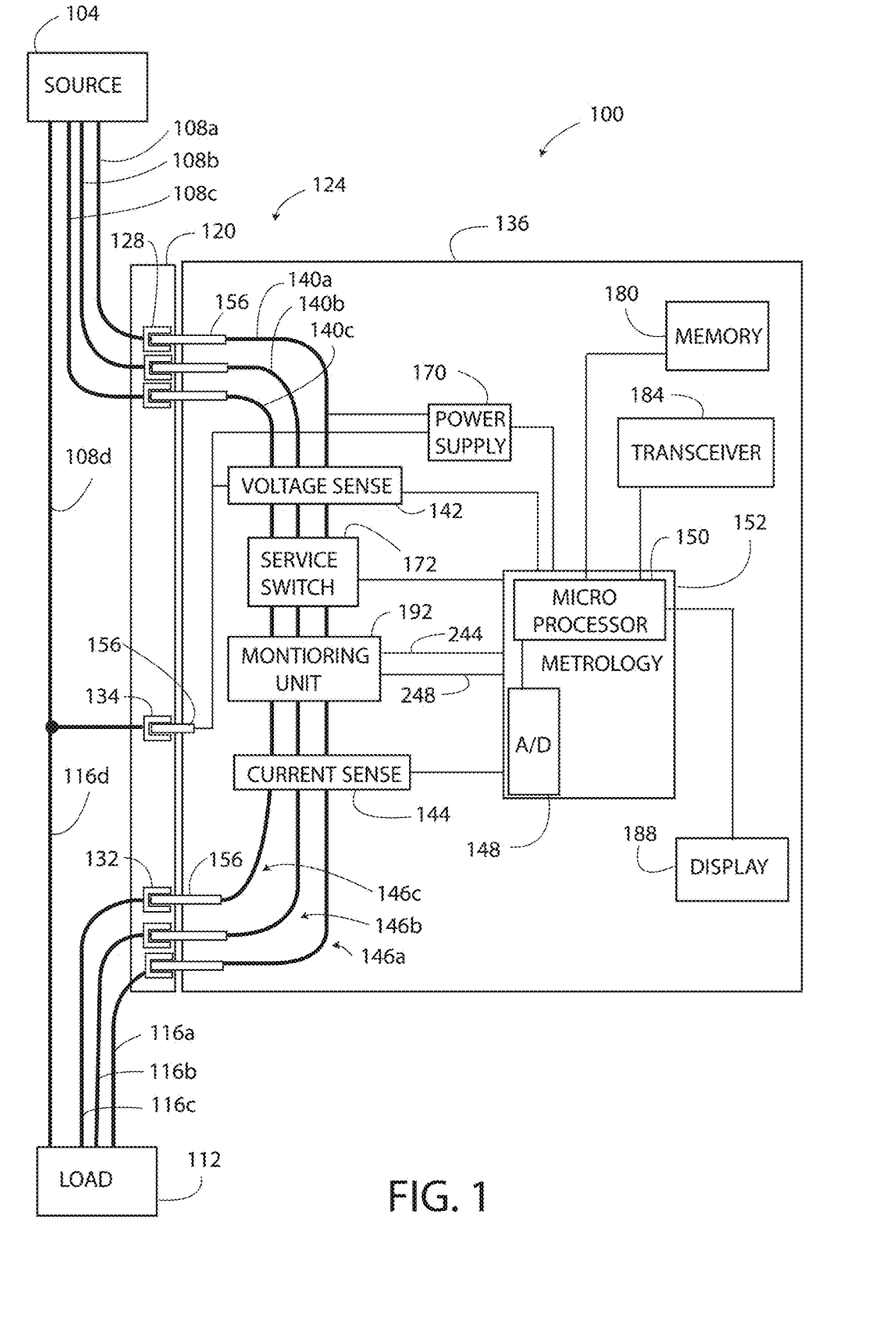
FIG. 1 is a block diagram illustrating an exemplary metering system including a utility meter having a service switch and a monitoring unit configured to determine the operating state of the service switch.

As shown in FIG. 1, a metering system 100 is electrically connected to a source 104 of electrical energy and to an electrical load 112 through electrical power lines 108 and electrical load lines 116. The electrical power lines 108 distribute electrical energy generated by the source 104 (also referred to herein as a utility service provider, an electrical service provider, or a utility) to the metering system 100. The electrical load lines 116 distribute electrical energy that passes through the metering system 100 to the load 112. The metering system 100 is configured to measure the consumption of electrical energy by the load 112.

The exemplary embodiment described herein involves a three phase, 4 wire electrical service as is known in the art. As a consequence, the power lines 108 include a phase A power line 108a, a phase B power line 108b, a phase C power line 108c, and a neutral line 108d. Likewise, the load lines 116 includes a phase A load line 116a, a phase B load line 116*b*, a phase C load line 116*c*, and a neutral line 116*d*. Each of the load lines 116*a*, 116*b*, 116*c*, 116*d* is coupled to the corresponding power line 108*a*, 108*b*, 108*c*, 108*d* as will be discussed below in further detail.

The metering system 100 includes a mounting device 120 and a utility meter 124 mounted to the mounting device 120. In the exemplary arrangement of FIG. 1, the mounting device 120 includes three line-side sockets 128 electrically connected to the source 104 through the power lines 108*a*, 108*b*, 108*c*, and three load-side sockets 132 electrically connected to the load 112 through the load lines 116*a*, 116*b*, 116*c*. The mounting device 120 further includes a neutral line socket 134 coupled to the neutral lines 108*d*, 116*d*. Accordingly, the load 112 is configured to receive three-phase electrical power form the source 104 through the meter 124. The sockets 128, 132, 134 are formed from metal and are configured to withstand high currents and voltages. In other embodiments, the mounting device 120 includes any suitable number of sockets 128, 132, 134 formed from any suitable material, as may be determined by the electrical power demands of the load 112.

The utility meter 124 includes a housing 136, at least one current coil 140, voltage sensors 142, current sensors 144, a service switch 172, a monitoring unit 192, and a metrology unit 152. In this embodiment, the current coils 140 consist of three current coils 140*a*, 140*b*, 140*c*, corresponding to phase A, phase B, and phase C of the electrical source 104. The current coils 140*a*, 140*b*, 140*c* are electrical conductors (e.g. copper conductors) that are located at least partially within the housing 136 and are configured for electrical connection to the power lines 108*a*, 108*b*, 108*c* and the load lines 116*a*, 116*b*, 116*c*. Each current coils 140*a*, 140*b*, 140*c* couples the corresponding power line 108*a*, 108*b*, 108*c* to the respective load line 116*a*, 116*b*, 116*c* through the service switch 172. Each of the current coils 140 includes two blades 156, which are configured to partially extend from the housing 136. The blades 156 are configured to provide a mechanically and electrically sound connection between the current coils 140 and the sockets 128, 132. The current coils 140 and the blades 156 may also mechanically support the meter 124 in a mounted position (as shown in FIG. 1) on the mounting device 120. As discussed above, each current coil 140 is configured to carry one of the phase A, B, and C line voltages, respectively. The current coils 140 and the power lines 108, 116 are configured to define three circuit paths 146*a*, 146*b*, 146*c* for carrying electrical energy between the source 104 and the load 112.

The voltage sensors 142 include circuitry capable or configured to generate a voltage measurement signal representative of each of the voltages on the current coils 140*a*, 140*b*, 140*c*. Each of the voltage sensors 142 may suitably comprise a voltage divider (not shown) coupled to each of the current coils 140*a*, 140*b*, 140*c*. Such voltage sensors 142 are conventional. The voltage sensors 142 are operably coupled to an analog to digital converter 148 of the metrology unit 152 in order to provide the voltage measurement signals to the metrology unit 152.

The current sensors 144 are disposed in a current sensing relationship with respect to the current coils 140*a*, 140*b*, 140*c*. The current sensors 144 may be any conventional current sensor including current transformers. The current sensors 144 are configured to generate a scaled down version of the current passing through the current coils 140*a*, 140*b*, 140*c*. Each scaled down current constitutes a current measurement signal. Accordingly, in this embodiment the current coils 140*a*, 140*b*, 140*c* form a primary winding of a transformer formed with the current sensors 144. The current sensors 144 are electrically connected to the analog to digital converter 148 in order to couple the current measurement signals to the metrology unit 152.

The metrology unit 152 is any suitable circuit(s) configured to generate metering data or consumption data by detecting, measuring, and determining one or more electricity and/or electrical energy consumption values based on electrical energy flowing between the sockets 128, 132, 134. The metrology unit 152 includes the analog to digital (A/D) converter 148 and a processing circuit 150. The A/D converter 148 is operably coupled to receive the voltage measurement signals from the voltage sensors 142, and to receive the current measurement signals from the current sensors 144. The analog to digital converter 148 is configured to generate corresponding digital measurement signals that are processed by the processing circuit 150 to generate metering data.

With continued reference to FIG. 1, the utility meter 124 further includes a power supply 170, a memory 180, a transceiver 184, and a display 188. The power supply 170 generates an electrical power output that is suitable for powering at least the analog to digital converter 148 and the processing circuit 150 and preferably the transceiver 184, the display 188, and the memory 180. The power supply 170 is operably coupled to at least one power line (108*a* as shown in FIG. 1) to generate power therefrom.

The service switch 172, which is shown in the illustrated embodiment as a three phase service switch, is operably coupled to the circuit paths 146 and to the metrology unit 152 and is configurable in a closed state (first operating state) and an open state (second operating state). In the closed state, the service switch 172 is configured to form a closed circuit in each of the circuit paths 146*a*, 146*b*, 146*c*, which enables electrical power transfer from the source 104 to the load 112 through the power lines 108, 116 and the current coils 140. In a three phase system all three line voltages are applied to the load 112, when the three phase service switch 172 in the closed state. In the open state, the service switch 172 is configured to form an open circuit in the circuit paths 146*a*, 146*b*, 146*c*, which prevents electrical power transfer from the source 104 to the load 112 through the power lines 108, 116 and the current coils 140. In a three phase system all three line voltages are isolated from the load 112, when the three phase service switch 172 is in the open state.

The service switch 172 includes a relay or any other suitable device configured to controllably disconnect and re-connect electrical power to the load 112. In the illustrated embodiment, the service switch 172 is shown as being configured to connect and to disconnect three phase electrical power to the load 112. In some cases, the service switch 172 also includes a motor or solenoid for operating contacts of an electronic mechanical switch between the open state and the closed state. In the exemplary three phase system of FIG. 1, the service switch 172 may include three separate relays or other suitable devices. The metrology unit 152 may suitably be configured to control the state of the service switch 172 based on the billing status of the customer associated with the load 104 and the consumption level of the load, among other factors. The service switch 172 is configured to open or to close all three phases at once in order to prevent damage to three phase loads (load 112), such as motors and the like; accordingly, the service switch is not configured to offer individual line voltage control or individual phase control.

The memory 180 is operably coupled to the metrology unit 152 and is configured to store metering data generated by the metrology unit. Additionally, the memory 180 is configured to store program data for operating the utility meter 124 according to a method 500 (FIG. 5) described below, as well as storing any other electronic data used or generated by the metrology unit 152. The memory 180 is also referred to herein as a non-transitory machine readable storage medium.

The transceiver 184 is operably coupled to the metrology unit 152 and is configured to send electric data to the source 104 and/or to an external unit (not shown), and to receive electric data from the source and/or the external unit. In one embodiment, the transceiver 184 is a radio frequency ("RF") transceiver operable to send and to receive RF signals. In another embodiment, the transceiver 184 includes an automatic meter reading (AMR) communication module configured to transmit data to an AMR network and/or another suitable device. The transceiver 184 may also be configured for data transmission via the Internet over a wired or wireless connection. In other embodiments, the transceiver 184 is configured to communicate with an external device or the source 104 by any of various means used in the art, such as power line communication, telephone line communication, or other means of communication.

The display 188 is operably coupled to the metrology unit 152 and is configured to display data associated with the utility meter 124 in a visually comprehensible manner. For example, the display 188 may be configured to display the metering data generated by the metrology unit 152 and the state of the service switch 172 as determined by the monitoring unit 192. The display 188 is provided as any desired display device, such as a liquid crystal display unit, for example.

The monitoring unit 192, which is illustrated as a three phase monitoring unit, is operably coupled to the metrology unit 152 and to each of the circuit paths 146a, 146b, 146c. The monitoring unit 192 is configured to detect a presence and an absence of line voltage on the load 112 and to generate an open circuit signal (first output signal) responsive to the detection of the absence of line voltage on the load 112 and a closed circuit signal (second output signal) responsive to the detection of the presence of line voltage on the load 112. To facilitate the detection of the presence and the absence of line voltage on the load 112, the monitoring unit 192 is connected to the load side of the service switch 172 (between the service switch 172 and the load 112) so that the monitoring unit 192 is in electrical communication with each phase of the load 112 even when the service switch 172 is in the open state. The monitoring unit 192 is configured to generate the open circuit signal only when all three phases of the three phase service switch 172 are in the open state. The monitoring unit 192 is further configured to generate the closed circuit signal only when all three phases of the three phase service switch 172 are in the closed state.

In the illustrated embodiment, the monitoring unit 192 includes two separate digital electrical outputs 244, 248 that are each configured for connection to a respective digital input of the metrology unit 152. The outputs 244, 248 carry the closed circuit signal and the open circuit signal respectively, as digital signals (logical signals). In particular, the monitoring unit 192 is configured to generate the closed circuit signal as a digital high (logical "1") on the output 244. The output 244 carries a digital low (logical "0") when the monitoring unit 192 is not generating the closed circuit signal. The monitoring unit 192 is further configured to generate the open circuit signal as a digital low (logical "0") on the output 248. The output 248 carries a digital high (logical "1") when the open circuit signal is not being generated. Accordingly, by monitoring the digital outputs 244, 248 of the monitoring unit 192, the metrology unit 152 is configured to conclusively determine the operating state of the service switch 172.

In the illustrated embodiment, the monitoring unit 192 senses three analog signals, representative of the load side AC voltages, and generates digital control signals representative of "successful open," "successful close," "failed open," "failed close," as described in additional detail below. Therefore, the monitoring unit 192 relieves the processor 150 of the burden of sampling analog signals to determine the state of the three phase service switch 172.

Figure 2:
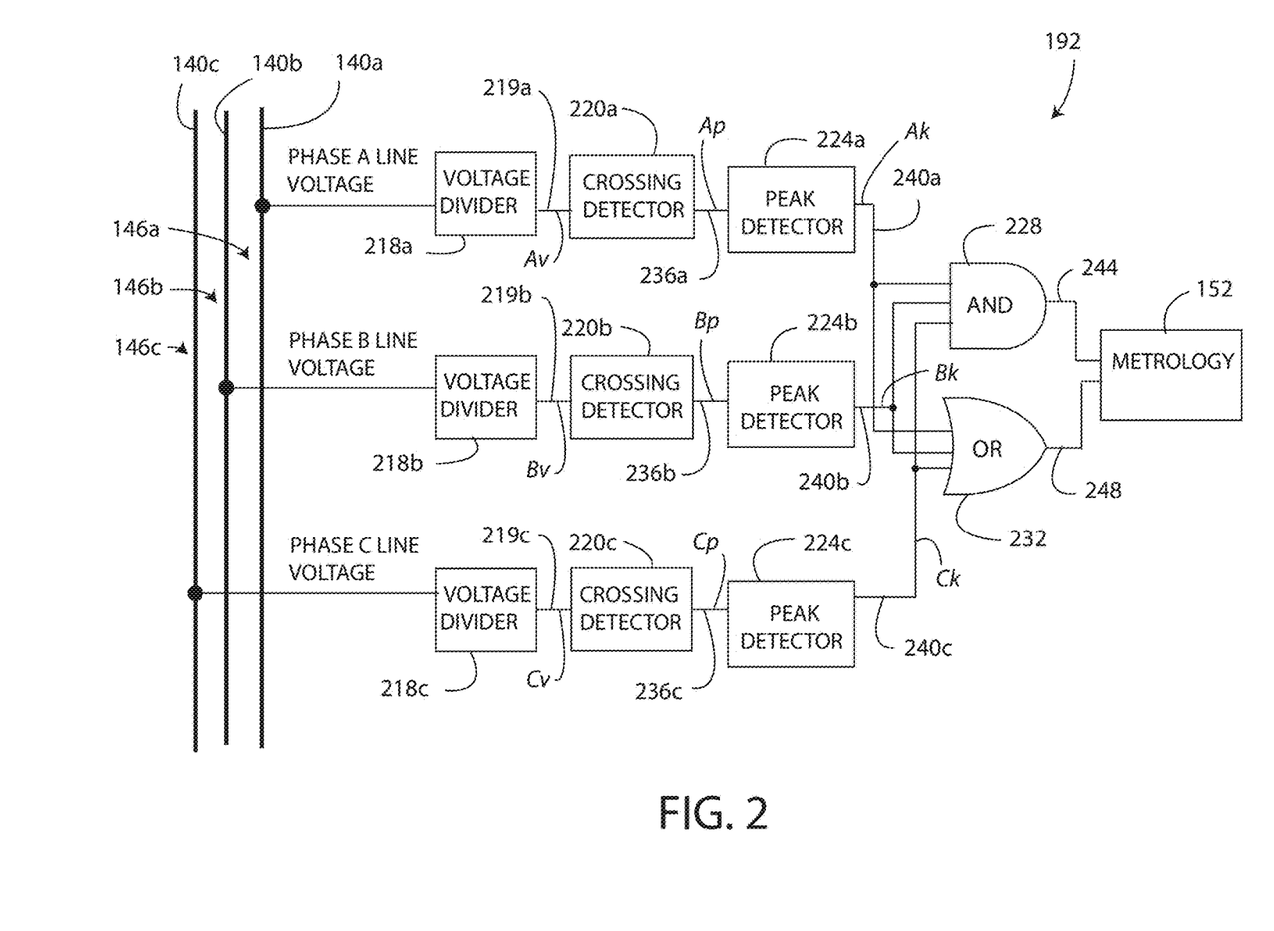
FIG. 2 is a block diagram illustrating the structure of an exemplary monitoring unit of the utility meter of FIG. 1.

As shown in FIG. 2, an exemplary embodiment of the monitoring unit 192 includes three voltage dividers 218a, 218b, 218c, three crossing detection circuits 220a, 220b, 220c, three peak detectors 224a, 224b, 224c, a logical AND circuit 228, and a logical OR circuit 232.

The voltage divider 218a is operably coupled to the phase A line voltage circuit path 146a and includes a voltage output 219a, which carries a divided voltage signal Av. The voltage divider 218b is operably coupled to the phase B line voltage circuit path 146b and includes a voltage output 219b, which carries a divided voltage signal By. Similarly, the voltage divider 218c is operably coupled to the phase C line voltage circuit path 146c and includes a voltage output 219c, which carries a divided voltage signal Cv. Each of the voltage dividers 218a, 218b, 218c is configured to convert a line voltage level (or a voltage representation of a line voltage) into a low voltage or reduced line signal. Each reduced line signal is superimposed on a DC voltage of a predetermined magnitude (DC bias voltage) to form the divided voltage signals Av, Bv, Cv, as described below in further detail. The voltage divider 218a is operably connected to provide the divided voltage signal Av to the crossing detection circuit 220a, the voltage divider 218b is operably connected to provide the divided voltage signal Bv to the crossing detection circuit 220b, and the voltage divider 218c is operably connected to provide the divided voltage signal Cv to the crossing detection circuit 220c. It will be appreciated that in some embodiments, the voltage dividers 218a, 218b, 218c may also be used as the voltage sensors 142 of FIG. 1.

Referring again specifically to FIG. 2, the crossing detection circuit 220a includes a pulse output 236a, which carries a pulse signal Ap (also referred to as a square waveform). The crossing detection circuit 220a compares a representation of the divided voltage signal Av to a reference voltage signal and generates a pulse on the pulse output 236a responsive to the representation of the divided voltage Av signal being less than the reference voltage signal. In one embodiment, the reference voltage signal is selected to have a magnitude less than the DC bias voltage. The reference voltage is effectively a load side voltage threshold, the magnitude of which correlates, in an exemplary embodiment, to an equivalent 40 Vrms load side voltage threshold. Thus, the crossing detection circuit 220a interprets a corresponding load side voltage that is below the reference voltage as a "logical zero" and a load side voltage that is above the reference voltage as a "logical one." Introducing the voltage threshold in the monitoring system 100 improves the reliability of detecting an open switch (open circuit) in the presence of electrical noise and line side voltage feedback paths.

The crossing detection circuit 220b includes a pulse output 236b and is configured to generate a corresponding pulse signal Bp based on the divided voltage signal Bv generated by the voltage divider 218b relative to the reference voltage signal. The crossing detection circuit 220c includes a pulse output 236c and is configured to generate a corresponding pulse signal Cp based on the divided voltage signal Cv generated by the voltage divider 218c relative to the reference voltage signal.

The peak detector 224a includes a peak output 240a and is configured to generate a peak signal Ak at the peak output 240a responsive to the pulse signal Ap generated by the crossing detection circuit 220a. The peak signal Ak is based on the peak magnitude of the pulse signal Ap. The peak detector 224b similarly includes a peak output 240b and is configured to generate a peak signal Bk at the peak output 240b responsive to the pulse signal Bp generated by the crossing detection circuit 220b. The peak detector 224c also includes a peak output 240c and is configured to generate a peak signal Ck at the peak output 240c responsive to the pulse signal Cp generated by the crossing detection circuit 220c.

The logical AND circuit 228 is operably coupled to each peak output 240a, 240b, 240c and is configured to perform the logical AND operation on the peak signals Ak, Bk, Ck generated by the peak detectors 224a, 224b, 224c. The logical AND circuit 228 includes an AND output 244, which carries the closed circuit signal.

The logical OR circuit 232 is operably coupled to each peak output 240a, 240b, 240c and configured to perform the logical OR operation on the peak signals Ak, Bk, Ck generated by the peak detectors 224a, 224b, 224c. The logical OR circuit 232 includes an OR output 248, which carries the open circuit signal.

Figure 3:
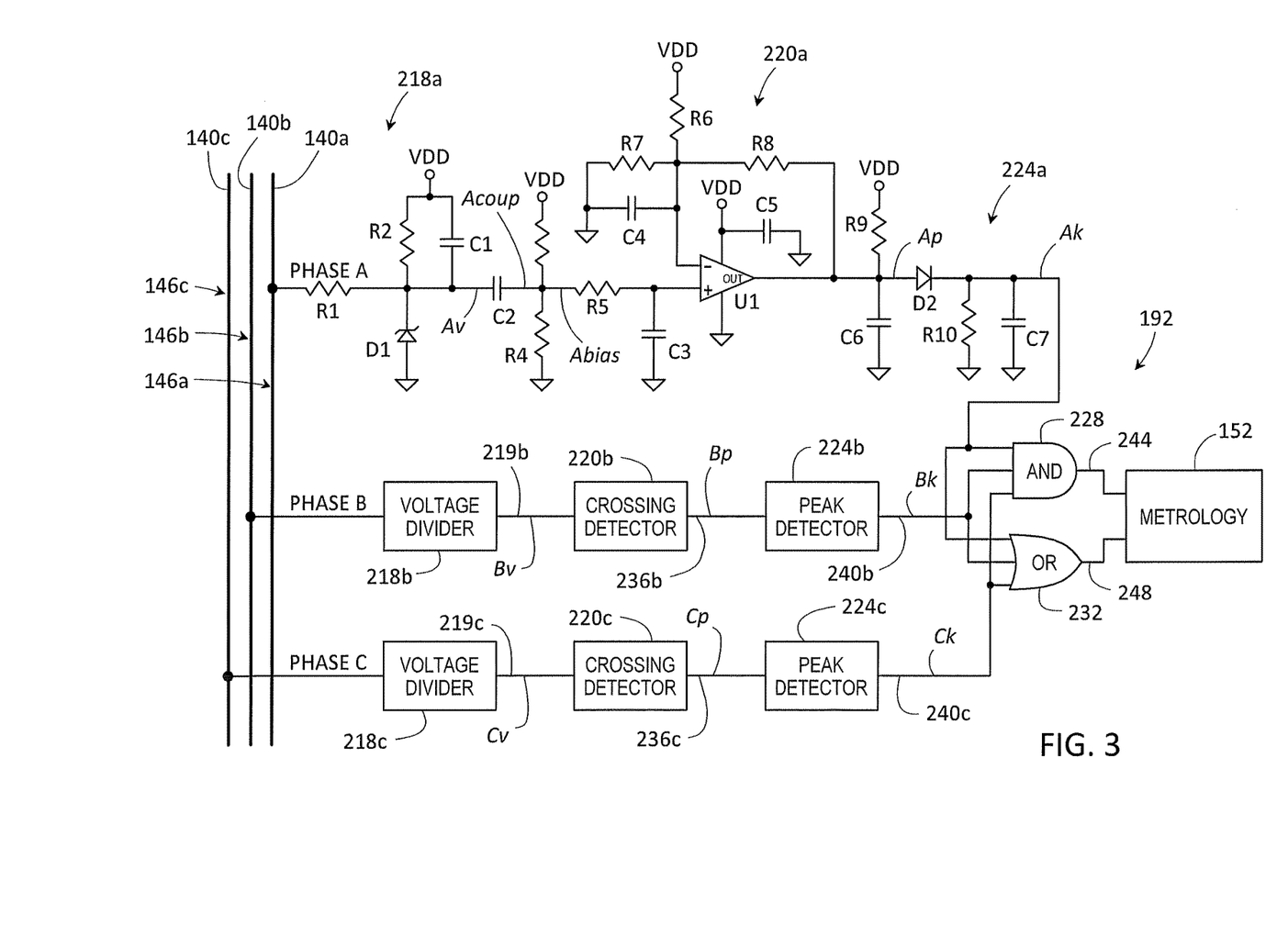
FIG. 3 is a schematic illustrating in further detail the structure of an exemplary monitoring unit of the utility meter of FIG. 1.

FIG. 3 shows in further detail an exemplary embodiment of the phase A branch of the monitoring unit 192. Referring to FIG. 3, the voltage divider 218a includes resistors R1 and R2 that are configured to generate a reduced line signal. Exemplary nominal values of R1 and R2 are one 1 MΩ and 2 kΩ respectively. The reduced line signal is an AC signal that is approximately 0.2% of the line voltage carried by the circuit path 146a. The reduced line signal is superimposed on a DC voltage generated by a voltage source VDD to form the divided voltage signal Av. The voltage source VDD in this exemplary embodiment has a magnitude of approximately 3.3V and is applied to resistor R2 and parallel connected capacitor C1, which has nominal value of 1033 pF. Thus, the divided voltage signal Av is an AC signal that is DC biased by the magnitude of the voltage source VDD. The voltage divider 218a further includes diode D1, which is a clamping diode configured to protect the monitoring unit 192 from high voltage spikes.

The divided voltage signal Av is AC coupled to the crossing detection circuit 220a. In particular, capacitor C2 having a nominal value of 0.1 µF is provided to AC couple the divided voltage signal Av to the crossing detection circuit 220a. Only the AC component of the divided voltage signal Av passes through capacitor C2 as a coupled signal Acoup. The resistors R3 and R4 form another voltage divider that superimposes the coupled signal Acoup onto the DC bias voltage to form a DC biased Abias signal that is similar to the divided voltage signal Av, but is DC biased by the DC bias voltage. The resistors R3 and R4 establish the magnitude of the DC bias voltage. In one embodiment, the resistors R3 and R4 have a nominal value of 287 kΩ and 100 kΩ, respectively, such that the DC bias voltage is approximately 0.85V. Therefore, the Abias signal is a sinewave signal alternating above and below the DC bias voltage. (See FIG. 4).

The crossing detection circuit 220a includes comparator U1, which includes an inverting input (a negative input), a non-inverting input (a positive input), and an output that forms the output of the crossing detection circuit 220a. The inverting input is configured to receive the Abias signal after the signal passes through a series connected resistor R5, which has nominal value of 10 kΩ. Capacitor C3, having a nominal value of 33 pF, is connected between the resistor R5 and the non-inverting input of the comparator U1 and DC ground.

The non-inverting input of the comparator U1 is coupled to resistors R6, R7, and R8. The resistor R6 has a nominal value of 318 kΩ and is further coupled to the voltage source VDD. Resistor R7, having a nominal voltage of 100 kΩ, is coupled to DC ground. Capacitor C4, which has a nominal value of 330 pF, is coupled in parallel with resistor R7. Resistor R8 is a feedback resistor, which has a nominal value in this example of 1 MΩ, is further coupled to the output of the comparator U1.

The resistors R6 and R7 establish the DC reference voltage signal, which is applied to the non-inverting input of the comparator U1 and to which the Abias signal is compared. Accordingly, in this exemplary embodiment the reference voltage signal is approximately 0.79V, which is less than the DC bias voltage of 0.85V.

The comparator U1 includes a positive rail connected to the voltage source VDD and a negative rail connected to DC ground. Capacitor C5, having a nominal value of 1 µF, is connected to the positive rail and DC ground.

The crossing detection circuit 220a further includes resistor R9 which in this example has a nominal value of 1 kΩ and is coupled between the voltage source VDD and the output of the comparator U1, and capacitor C6 that has a nominal value of 1000 pF and is coupled between the output of the comparator U1 and DC ground.

In response to the magnitude of the Abias signal (applied to the inverting input) being greater than the magnitude of the reference voltage signal (applied to the non-inverting input), the output of the comparator U1 (i.e. the pulse signal Ap) is approximately zero (logical "0"), and in response to the magnitude of the Abias signal being less than the reference voltage signal, the output of the comparator U1 is a pulse having a magnitude approximately equal to the voltage source VDD (logical "1"). The pulse signal Ap is injected into the peak detector 224a.

The peak detector 224a includes diode D2, resistor R10, and capacitor C7. The diode D2 is connected between capacitor C6 and resistor R10 and is oriented with an anode of the diode D2 configured to receive the pulse signal Ap. The resistor R10 and the capacitor C7 are connected in parallel between a cathode of the diode D2 and DC ground. The voltage across the capacitor C7 is the output of the peak detector 224a, and the voltage level to which the capacitor C7 is charged represents the peak signal Ak.

In response to receiving a pulse on the pulse output 236a of a duration in excess of approximately sixty milliseconds, the capacitor C7 is charged to approximately 3.3 volts (magnitude of the voltage source VDD) and the peak signal Ak is a voltage representing a logical "1" value. The values of the resistor R10 and the capacitor C7 are selected to provide a discharge time constant that will discharge the capacitor C7 in a predetermined time period in the absence of the pulse signal Ap. An exemplary predetermined time period is approximately forty seven microseconds, and exemplary values of the resistor R10 and the capacitor C7 are 47.5 kΩ and 1 µF, respectively. Thus, if the pulse signal Ap fails to carry a pulse for more than approximately the predetermined time period, then the capacitor C7 gradually discharges, such that the peak signal Ak becomes approximately zero volts (logical "0") value. The output of the peak detector 224a is the peak signal Ak, which is feed to the logical AND circuit 228 and the logical OR circuit 232.

The phases B and C branches of the monitoring unit 192 are constructed substantially identically to the phase A branch described above.

The logical AND circuit 228 includes a triple input AND gate that is configured to receive each peak signal Ak, Bk, Ck. The AND gate 282 is configured to generate a logical output signal that has a logical "1" value only when each peak signal Ak, Bk, Ck is at the logical "1" value. A logical "1" on the AND output 244 is the closed circuit signal, which indicates that line voltage has been detected on all three of the circuit paths 146 between the service switch 172 and the load 112 and that the service switch 172 is in the closed state.

The logical OR circuit 232 includes a triple input OR gate that is configured to receive each peak signal Ak, Bk, Ck. The OR gate 286 is configured to generate a logical output signal that has a logical "0" value only when each peak signal Ak, Bk, Ck is at the logical "0" value. A logical "0" on the OR output 248 is the open circuit signal, which indicates that line voltage is absent from all three of the circuit paths 146 between the service switch 172 and the load 112 and that the service switch 172 is in the open state.

Figure 4:
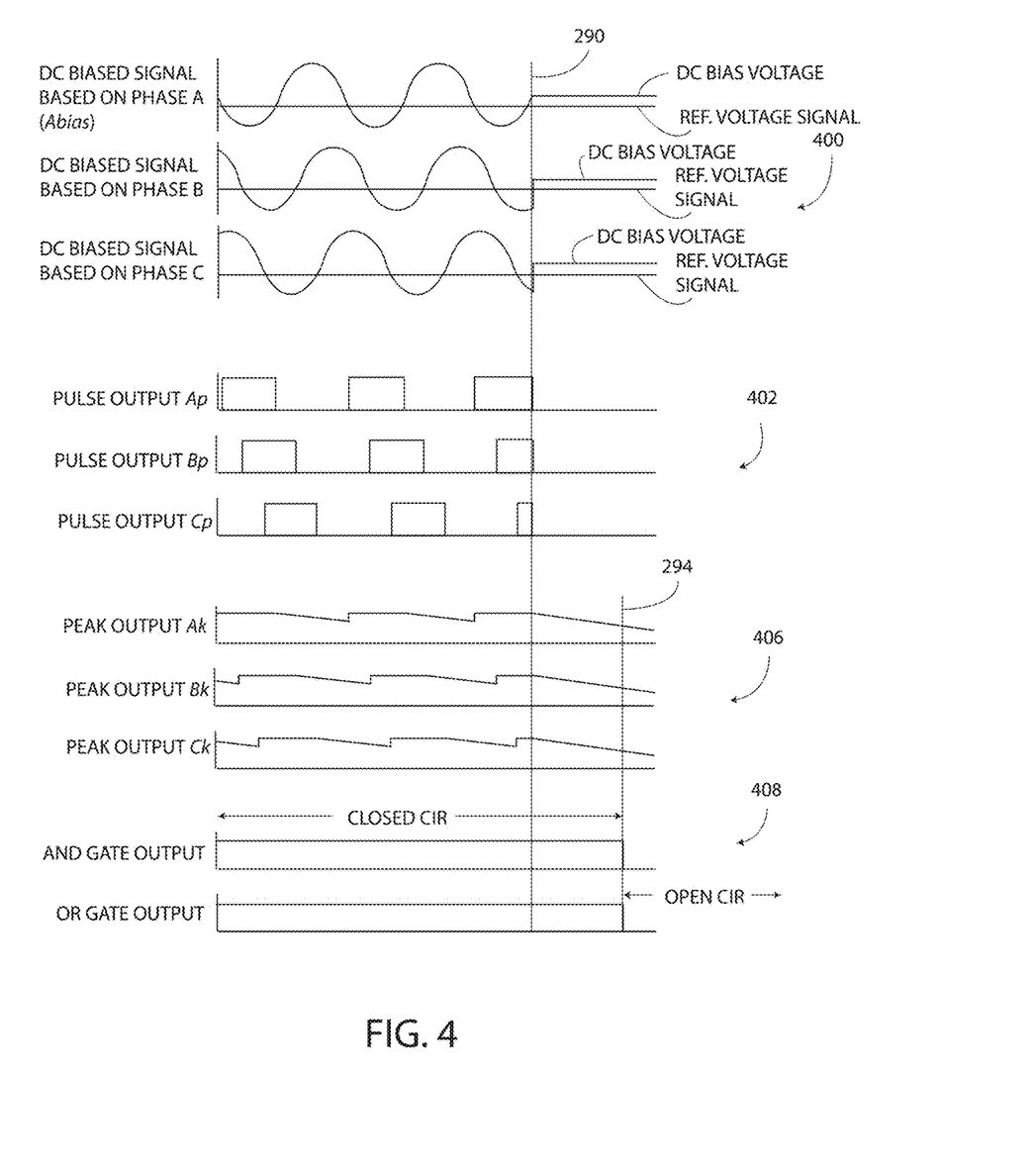
FIG. 4 illustrates a signal timing diagram of certain signals associated with the metering system of FIG. 1 when the service switch is in a closed state and an open state.

With reference to FIG. 4 a three phase signal is followed through the monitoring unit 192. As shown in FIG. 4, a DC biased signal graph 400 shows the DC biased signals which are input to the crossing detection circuits 220a, 220b, 220c (including the Abias signal) along with the reference voltage signal, which is a constant magnitude DC voltage. The voltages on the left of a disconnect line 290 are input to the crossing detection circuits 220a, 220b, 220c when the service switch 172 is in the closed configuration, and the voltages to the right of the disconnect line 290 are input to the crossing detection circuits 220a, 220b, 220c when the service switch is in the open configuration. The DC biased signals are sinewave signals alternating above and below the DC bias voltage.

As shown by the pulse output graph 402, the pulse signals Ap, Bp, Cp have a logical "1" in response to the DC biased signal being less than the reference voltage signal and a logical "0" in response to the DC biased signal being greater than the reference voltage signal. With regard to the Phase A signal, the comparator U1 forms the pulse signal Ap by comparing the Abias signal to the reference voltage signal. The other pulse signals Bp, Cp are generated in a substantially identical manner. At times subsequent to the disconnect line 290 the pulse signals Ap, Bp, Cp remain at zero volts (logical "0"), in response to the DC biased voltages being greater than the reference voltage signal.

Next, in the peak output graph 406, the charging effect of the pulse signals Ap, Bp, Cp is shown as holding the peak signals Ak, Bk, Ck at the logical "1" for as long as the pulse outputs 236a, 236b, 236c deliver a regular stream of pulses. The peak signals Ak, Bk, Ck gradually decrease in magnitude on the "positive half cycle" of the corresponding DC biased signals, but remain a logical "1." Subsequent to the disconnect line 290, the peak signals Ak, Bk, Ck decrease in magnitude and at a transition line 294 each peak signals Ak, Bk, Ck transitions from a logical "1" to a logical "0."

The logic gate graph shows the AND output 244 and the OR output 248 when the service switch 172 is configured in the open state and the closed state. The closed circuit signal is shown to the left of the transition line 294 as a logical "1" carried by the AND output 244, which indicates that line voltage has been detected (monitored) on all three circuit paths 146 and confirms that the service switch 172 is in the closed configuration. The closed circuit signal is not generated to the right of the transition line 294 as evidenced by the logical "0" carried by the AND output 244. The open circuit signal is shown to the right of the transition line 294 as a logical "0" signal carried by the OR output 248, which indicates that line voltage is absent on all three circuit paths 146 and confirms that the service switch 172 is in the open configuration or that an outage has occurred at the source 104. The open circuit signal is not generated to the left of the transition line 294 as evidenced by the logical "1" carried by the OR output 248.

Figure 5:
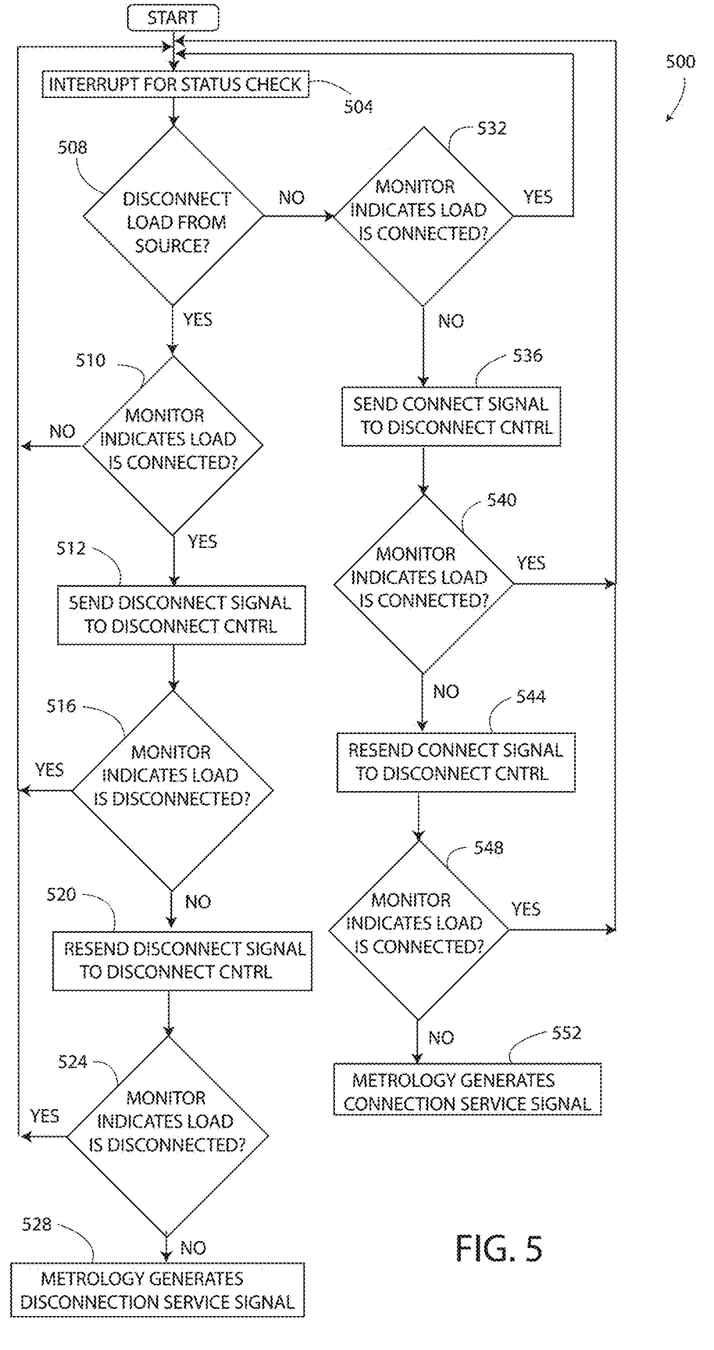
FIG. 5 is a flowchart illustrating an exemplary method of operating the metering system of FIG. 1.

The flowchart of FIG. 5, illustrates a method 500 of using the monitoring unit 192 to determine the status of the service switch 172. In block 504, an interrupt causes the processing circuit 150 of the metrology unit 152 to execute a subroutine stored in the memory 180 that corresponds to the method 500.

In block 508, the metrology unit 152 determines if the load 112 should be disconnected from the source 104. To this end, the metrology unit 152 refers to certain data stored in the memory 180 in order to determine the desired connection status. In one embodiment, the metrology unit 152 uses a flag stored in the memory 180 that is indicative of the desired connection state. Typically, the source 104 sends (either remotely or directly) an electric signal to the metrology unit 152 that includes data indicative of the desired connection state.

Next in block 510, if the metrology unit 152 determines that the three phase load 112 should be disconnected from the source 104, then the metrology unit 152 determines if the service switch 172 is in the open state by monitoring the monitoring unit 192 for the generation of the open circuit signal on the OR output 248. If the metrology unit 152 detects the open circuit signal, then the metrology unit 152 determines that the three phase service switch is in the open state and stops the method 500 until the next interrupt (block 504). If, however, the metrology unit 152 detects the closed circuit signal, then the metrology unit 152 determines that at least one phase of the three phase service switch 172 is undesirably in the closed state.

In block 512, the metrology unit 152 sends a disconnect signal to the service switch 172 in order to transition the service switch to the open state. Under normal operating conditions, the service switch 172 enters the open state responsive to receiving the disconnect signal, thereby electrically disconnecting the load 112 from the source 104.

In block 516, the metrology unit 152 again monitors the three phase monitoring unit 192 for the generation of the open circuit signal in order to determine that the three phase service switch 172 has successfully entered the open state. When the service switch 172 is operating properly, the metrology unit 152 detects the open circuit signal and determines that the service switch has successfully entered the open state at which time the metrology unit 152 stops the method 500 until the next interrupt (block 504). If, however, the metrology unit 152 detects the closed circuit signal, then the metrology unit 152 determines that the service switch 172 has failed to successfully enter the open state.

In block 520 responsive to detecting that the service switch 172 has failed to enter the open state, the metrology circuit 152 resends the disconnect signal to the service switch 172.

At block 524, the metrology unit 152 checks if the resent disconnect signal has caused the service switch 172 to enter the open state by monitoring for the open circuit signal as generated by the monitoring unit 192. If the open circuit signal is detected, then the metrology unit 152 determines that the resent disconnect signal has caused the service switch 172 to enter the open state and the metrology unit stops the method 500 until the next interrupt (block 504). If, however, the closed circuit signal is detected then the metrology unit 152 determines that the resent disconnect signal has failed to cause the service switch 172 to enter the open state and, as shown in block 528, the metrology unit 152 generates a disconnection service signal to indicate that the service switch was unable to enter the open state.

The disconnection service signal generated in block 528, in one embodiment, is an electronic signal that is sent to the source 104 or to another device via the transceiver 184. In addition, the disconnection service signal may take the form of an illuminated portion of the display 188 to visually alert a technician of the potential issue. In other embodiments, the disconnection service signal is any other type of signal as may be desired by those of ordinary skill in the art.

With reference again to block 508, if the monitoring unit 152 determines that the load 112 should not be disconnected from the source, then the metrology unit confirms that the service switch 172 is in the closed state, as shown in block 532.

In block 532, the metrology unit 152 monitors for the generation of the closed circuit signal on the AND output 244 in order to determine that the service switch 172 is in the closed state. If the metrology unit 152 detects the closed circuit signal then, the metrology unit 152 stops the method 500 until the next interrupt (block 504). If, however, the metrology unit 152 detects the open circuit signal, then the metrology unit 152 determines that at least one phase of the three phase service switch 172 is undesirably in the open state.

In block 536 the metrology unit 152 sends a connect signal to the service switch 172 to cause the service switch 172 to enter the closed state. Under normal operating conditions, the service switch 172 enters the closed state responsive to receiving the connect signal, thereby electrically connecting the load 112 to the source 104.

In block 540, the metrology unit 152 again uses the monitoring unit 192 to determine if the service switch 172 has successfully entered the closed state by checking the AND output 244 for the closed circuit signal. If the metrology unit 152 detects the closed circuit signal then, the metrology unit 152 stops the method 500 until the next interrupt (block 504). If, however, the metrology unit 152 detects the open circuit signal, then the metrology unit 152 determines that the service switch 172 has failed to enter the closed state.

In block 544 responsive to detecting that the service switch 172 has failed to enter the closed state, the metrology circuit 152 resends the connect signal to the service switch 172.

At block 548, the metrology unit 152 checks if the resent disconnect signal has caused the service switch 172 to enter the closed state. As in block 540, the metrology unit 152 checks for the closed circuit signal as carried by the AND output 244. If the closed circuit signal is detected, the metrology unit 152 determines that the resent connect signal has caused the service switch 172 to enter the closed state and the metrology unit stops the method 500 until the next interrupt (block 504). If, however, the open circuit signal is detected, then the metrology unit 152 determines that the resent connect signal failed to cause the service switch 172 to enter the closed state and, as shown in block 552, generates a connection service signal to indicate that the service switch 172 was unable to enter the closed state.

The connection service signal generated in block 552, in one embodiment, is an electronic signal that is sent to the source 104 or to another device via the transceiver 184. In addition, the connection service signal may take the form of an illuminated portion of the display 188 to visually alert a technician of the potential issue. In other embodiment, the connection service signal is any other type of signal as may be desired by those of ordinary skill in the art.

The utility meter 124 enables the metrology unit 152 to quickly and easily determine the status of the service switch 172 by monitoring the digital output of just two signal lines 244, 248 from the monitoring unit 192. Additionally, the two separate output lines 244, 248 enable the metrology unit 152 to conclusively determine the operating state of the service switch 172, since the OR output 248 carries the open circuit signal only when the service switch is in the open state, and the AND output 244 carries the closed circuit signal only when the service switch is in the closed state.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. An arrangement for use in a utility meter comprising:
    at least one circuit path operably coupling a source of electrical energy to a load;
    a service switch operably coupled to the at least one circuit path and configurable in (i) an open state in which an open circuit is formed in the at least one circuit path, and (ii) a closed state in which a closed circuit is formed in the at least one circuit path; and
    a monitoring unit operably coupled to the at least one circuit path between the load and the service switch and configured to detect a presence and an absence of line voltage on the load, the monitoring unit further configured (i) to generate an open circuit signal responsive to the detection of the absence of line voltage on the load, and (ii) to generate a closed circuit signal responsive to the detection of the presence of line voltage on the load;
    wherein the monitoring unit includes:
        a first crossing detection circuit operably coupled to receive a first electrical signal corresponding to a first line voltage on the load;
        a second crossing detection circuit operably coupled to receive a second electrical signal corresponding to a second line voltage on the load;
        a first peak detection circuit operably coupled to the first crossing detection circuit and configured to generate a first peak signal based on an output signal of the first crossing detection circuit;
        a second peak detection circuit operably coupled to the second crossing detection circuit and configured to generate a second peak signal based on an output signal of the second crossing detection circuit; and
        a first logic circuit operably coupled to the first and second peak detection circuits and configured to generate the open circuit signal responsive to each of the first and second peak signals being less than a predetermined value.

2. The arrangement of claim 1, wherein the monitoring unit is operably coupled to each of three circuit paths of the at least one circuit path, and is further configured to detect the presence and the absence of line voltage on the load for each of the three circuit paths.

3. The arrangement of claim 2, wherein the monitoring unit includes a first signal line configured to carry the open circuit signal, and a second signal line configured to carry the closed circuit signal.

4. The arrangement of claim 1, wherein the monitoring unit further includes a second logic circuit operably coupled to the first and second peak detection circuits and configured to generate the closed circuit signal responsive to each of the first and second peak signals being greater than or equal to the predetermined value.

5. The arrangement of claim 4, wherein:
the monitoring unit further includes a third crossing detection circuit operably coupled to receive a third electrical signal corresponding to a third line voltage on the load, and a third peak detection circuit operably coupled to the third crossing detection circuit and configured to generate a third peak signal based on an output signal of the third crossing detection circuit,
the first logic circuit is operably coupled to the third peak detection circuit and is configured to generate the open circuit signal responsive to each of the first, second, and third peak signals being less than the predetermined value, and
the second logic circuit is operably coupled to the third peak detection circuit and is configured to generate the closed circuit signal responsive to each of the first, second, and third peak signals being greater than or equal to the predetermined value.

6. The arrangement of claim 4, wherein:
the first logic circuit includes a logical OR circuit, and
the second logic circuit includes a logical AND circuit.

7. A method of operating a utility meter comprising:
disconnecting a load from a source of electrical energy by forming an open circuit in at least one circuit path operably coupling the source to the load with a service switch;
connecting the load to the source of electrical energy by forming a closed circuit in the at least one circuit path with the service switch;
detecting a presence or an absence of line voltage on the load;
generating an open circuit signal responsive to the detection of the absence of line voltage on the load;
generating a closed circuit signal responsive to the detection of the presence of line voltage on the load;
sending a disconnect signal to the service switch with a metrology unit operably coupled to the service switch;
sending a connect signal to the service switch with the metrology unit;
determining that the disconnect signal has caused the service switch to form the open circuit in the at least one circuit path by detecting the open circuit signal with the metrology unit; and
determining that the connect signal has caused the service switch to form the closed circuit in the at least one circuit path by detecting the closed circuit signal with the metrology unit.

8. The method of claim 7 wherein three circuit paths operably couple the source of electrical energy to the load, the method further comprising:
detecting the presence or the absence of line voltage on the load for each of the three circuit paths.

9. The method of claim 8 further comprising:
providing the open circuit signal on a first signal line; and providing the closed circuit signal on a second signal line separate from the first signal line.

10. The method of claim 7, further comprising:
resending the disconnect signal to the service switch if the metrology unit detects the closed circuit signal after sending the disconnect signal to the service switch; and
resending the connect signal to the service switch if the metrology unit detects the open circuit signal after sending the connect signal to the service switch.

11. The method of claim 10 further comprising:
generating a disconnection service signal with the metrology unit if after resending the disconnect signal the metrology unit detects the closed circuit signal; and
generating a connection service signal with the metrology unit if after resending the connect signal the metrology unit detects the open circuit signal.

12. The method of claim 7 further comprising:
detecting a voltage crossing on a first electrical signal corresponding to a first line voltage on the load with a first crossing detection circuit;
detecting a voltage crossing on a second electrical signal corresponding to a second line voltage on the load with a second crossing detection circuit;
generating a first peak signal based on an output signal of the first crossing detection circuit with a first peak detection circuit operably connected to the first crossing detection circuit;
generating a second peak signal based on an output signal of the second crossing detection circuit with a second peak detection circuit operably connected to the second crossing detection circuit;
generating the open circuit signal with a first logic circuit operably connected to the first and second peak detection circuits when the first and second peak signals are less than a predetermined value; and
generating the closed circuit signal with a second logic circuit operably connected to the first and second peak detection circuits when the first and second peak signals are greater than or equal to the predetermined value.

13. The method of claim 12 further comprising:
generating the open circuit signal with an output of a logical AND circuit of the first logic circuit; and
generating the closed circuit signal with an output of a logical OR circuit of the second logic circuit.

14. A method of operating a utility meter comprising:
disconnecting a load from a source of electrical energy by forming an open circuit in at least one circuit path operably coupling the source to the load with a service switch;
connecting the load to the source of electrical energy by forming a closed circuit in the at least one circuit path with the service switch;
detecting a voltage crossing on a first electrical signal corresponding to a first line voltage on the load with a first crossing detection circuit;
generating a first peak signal based on an output signal of the first crossing detection circuit with a first peak detection circuit operably connected to the first crossing detection circuit;
generating an open circuit signal with a first logic circuit operably connected to the first peak detection circuit responsive at least in part to the first peak signal being less than a predetermined value; and determining that the disconnect signal has caused the service switch to form the open circuit in the at least one circuit path by detecting the open circuit signal with the metrology unit.

15. The method of claim 14 further comprising:

detecting a voltage crossing on a second electrical signal corresponding to a second line voltage on the load with a second crossing detection circuit;

generating a second peak signal based on an output signal of the second crossing detection circuit with a second peak detection circuit operably connected to the second crossing detection circuit;

generating the open circuit signal with the first logic circuit further responsive at least in part to the second peak signal being less than the predetermined value.

16. The method of claim 15, further comprising:

generating a closed circuit signal with a second logic circuit operably connected to the first detection circuit responsive at least in part to the first peak signal being greater than the predetermined value.

17. The method of claim 16 further comprising:

generating the closed circuit signal with the second logic circuit further responsive at least in part to the second peak signal being greater than the predetermined value.

\* \* \* \* \*